(12) United States Patent
Homma

(10) Patent No.: US 7,211,930 B2
(45) Date of Patent: May 1, 2007

(54) MULTILAYER PIEZOELECTRIC ELEMENT

(75) Inventor: Mitsunao Homma, Akita (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/089,167

(22) Filed: Mar. 25, 2005

(65) Prior Publication Data
US 2005/0269910 A1    Dec. 8, 2005

(30) Foreign Application Priority Data
Apr. 5, 2004    (JP)    ............... 2004-111411

(51) Int. Cl.
*H01L 41/047* (2006.01)
(52) U.S. Cl. ............ 310/322; 310/365; 310/366
(58) Field of Classification Search ........... 310/322, 310/328, 365, 366
See application file for complete search history.

(56) References Cited

U.S. PATENT DOCUMENTS

| | | | |
|---|---|---|---|
| 5,089,739 A | * | 2/1992 | Takahashi et al. .......... 310/328 |
| 5,237,239 A | * | 8/1993 | Inoue et al. ................. 310/328 |
| 6,054,793 A | * | 4/2000 | Kawai et al. ................ 310/312 |
| 6,930,435 B2 | * | 8/2005 | Boecking ..................... 310/317 |
| 7,003,858 B2 | * | 2/2006 | Sube et al. ................. 29/25.35 |
| 7,056,443 B2 | * | 6/2006 | Sasaki et al. .................. 216/18 |

FOREIGN PATENT DOCUMENTS

JP    A-11-087790    3/1999

* cited by examiner

*Primary Examiner*—Darren Schuberg
*Assistant Examiner*—Derek Rosenau
(74) *Attorney, Agent, or Firm*—Oliff & Berridge, PLC

(57) ABSTRACT

A multilayer piezoelectric element is provided with a multilayer body in which internal electrodes are arranged between stacked piezoelectric layers. The multilayer body has an active part piezoelectrically active, and nonactive parts piezoelectrically nonactive. The nonactive parts are located so as to interpose the active part in between in a direction intersecting with a displacement direction of the active part. The nonactive parts are provided with a release portion for releasing restraint on displacement of the active part.

3 Claims, 12 Drawing Sheets

Fig.2
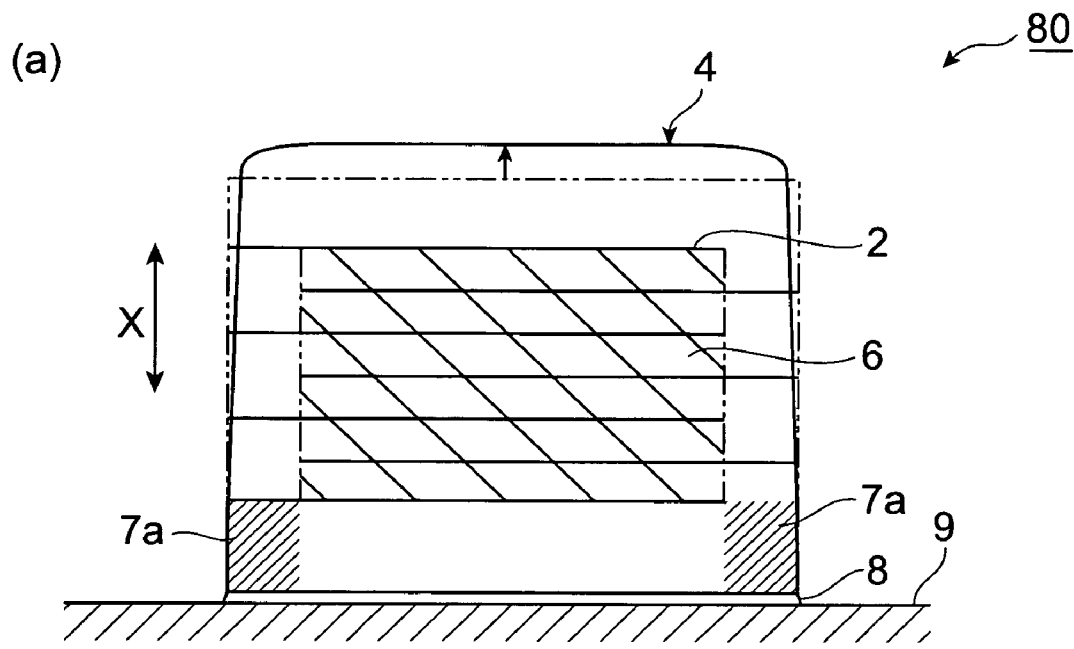
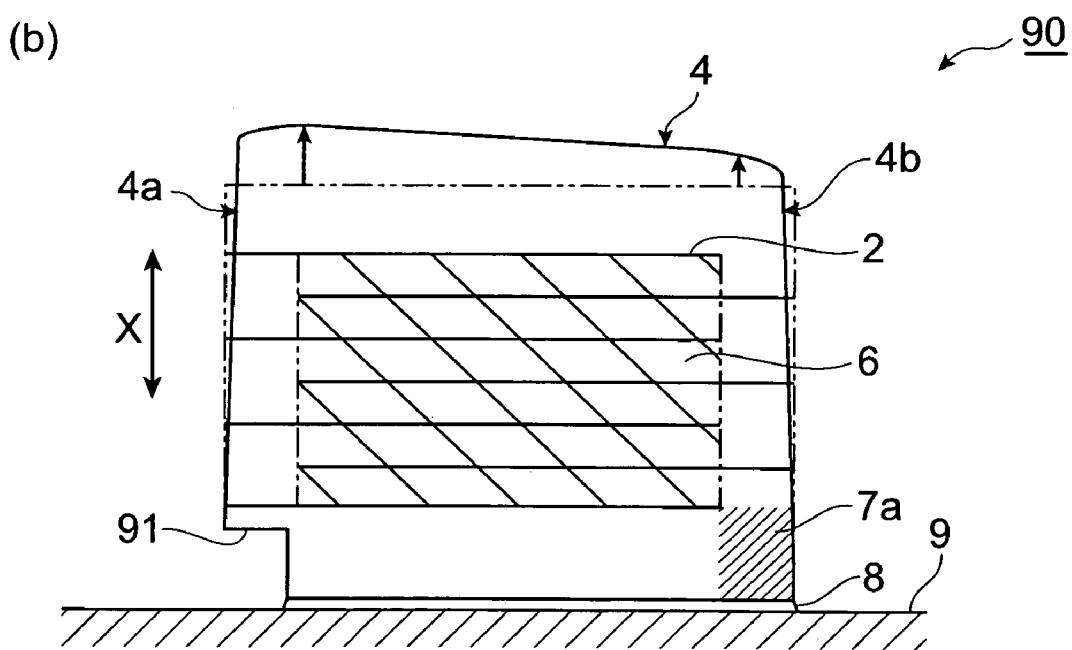

Fig.4
(a)
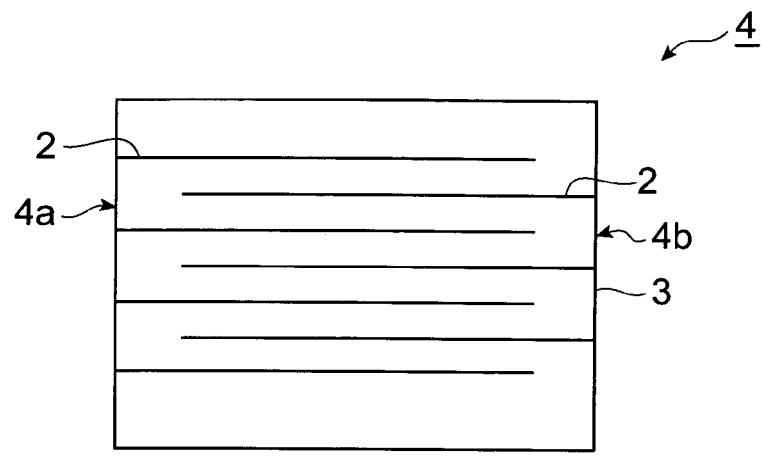
(b)
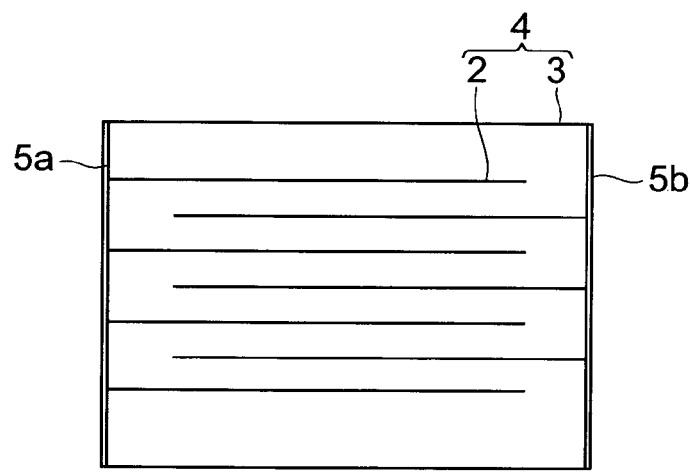
(c)
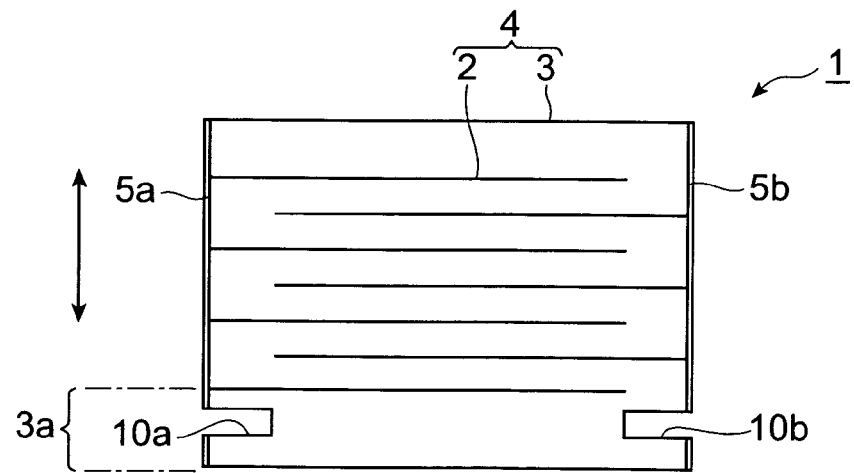

Fig.7
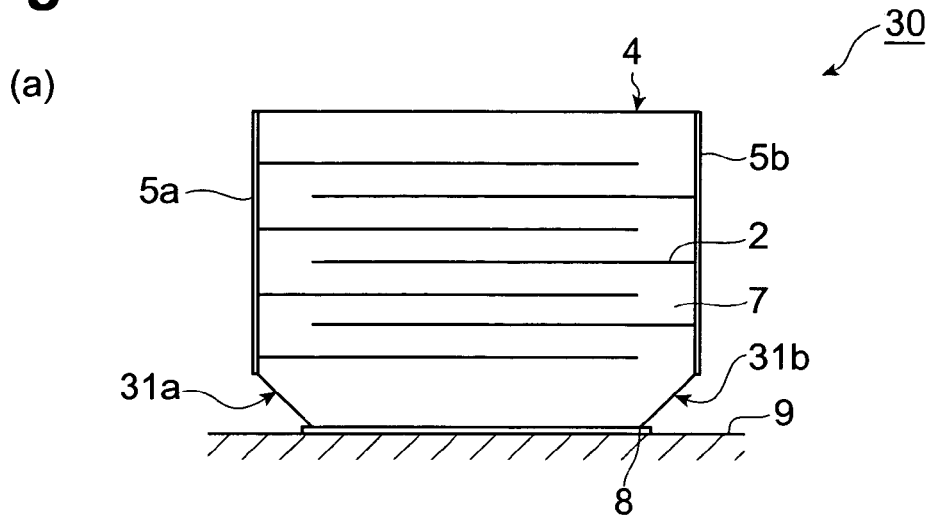
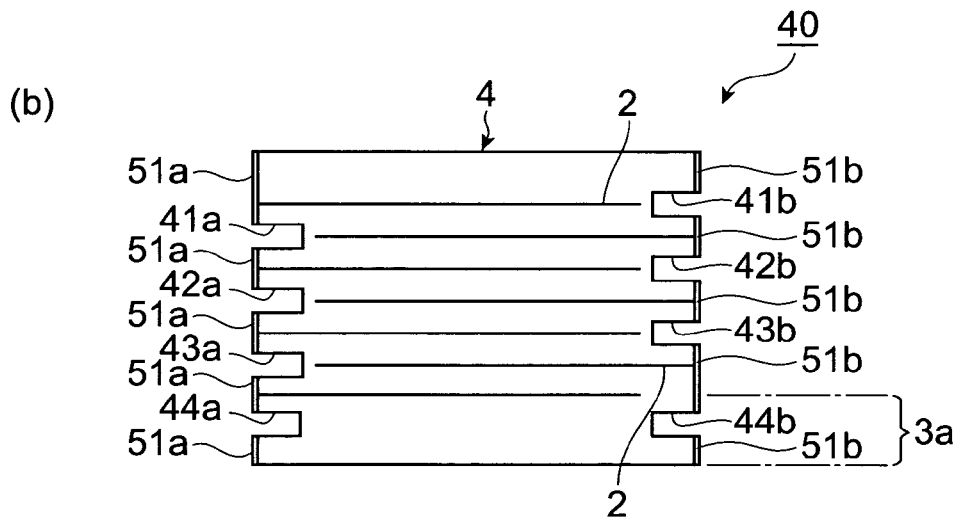
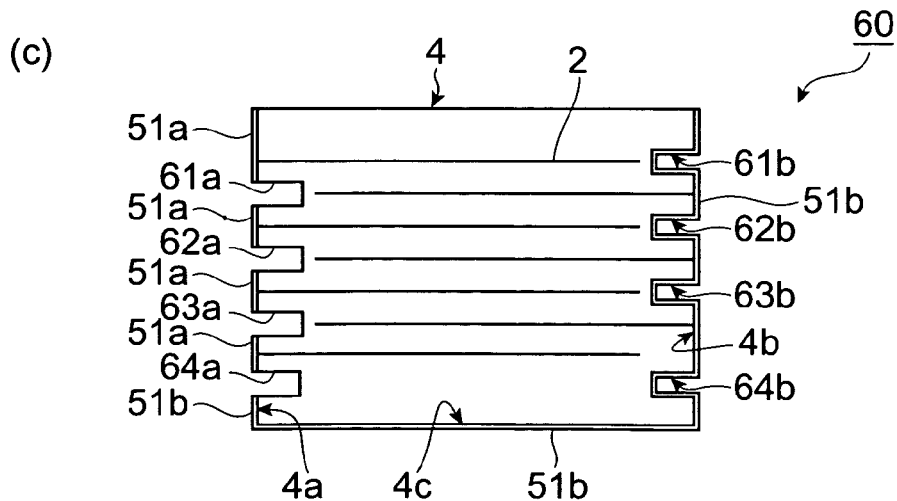

MULTILAYER PIEZOELECTRIC ELEMENT

BACKGROUND OF THE INVENTION

1. Field of the Invention

The present invention relates to a multilayer piezoelectric element.

2. Related Background Art

An example of the conventional multilayer piezoelectric elements is a piezoelectric actuator disclosed in Japanese Patent Application Laid-Open No. 11-87790. The piezoelectric actuator described in this Japanese Patent Application Laid-Open No. 11-87790 has an actuator body, and external electrodes formed on end faces of this actuator body. The actuator body is composed of a stack of piezoelectric sheets with internal electrodes formed thereon. In this piezoelectric actuator, one outermost layer of the actuator body serves as an active part, and the other outermost layer as a nonactive part. When a voltage is applied to the external electrodes, the active part becomes distorted, while the nonactive part remains undistorted; therefore, the actuator body is curved in the stack direction, so that the whole becomes displaced in a direction (displacement direction) nearly perpendicular to the stack direction. Here the active part is a portion that becomes distorted by piezoelectric effect, while the nonactive part is a portion that is not distorted by piezoelectric effect.

SUMMARY OF THE INVENTION

In the above-described piezoelectric actuator, however, the nonactive part restrains the displacement in the displacement direction, so as to fail to achieve a satisfactory displacement amount. Since the actuator body is curved in the stack direction, the displacement amount varies in the displacement direction of the actuator body.

The present invention has been accomplished in view of the problem in the conventional technology, and an object of the invention is to provide a multilayer piezoelectric element capable of suppressing the decrease of the displacement amount and reducing the variation of displacement amount.

An aspect of the present invention is a multilayer piezoelectric element comprising a multilayer body in which internal electrodes are placed between stacked piezoelectric layers, wherein the multilayer body has an active part which is piezoelectrically active, and nonactive parts which are piezoelectrically nonactive and which are located so as to interpose the active part in between in a direction intersecting with a displacement direction of the active part, and wherein the nonactive parts are provided with at least one release portion for releasing restraint on displacement of the active part. The term "piezoelectrically active" in the present invention means "distorted by piezoelectric effect."

According to the present invention, the release portion releases the restraint force caused by the nonactive parts when the active part is displaced, i.e., when the active part becomes distorted by piezoelectric effect; this reduces the restraint and successfully suppresses the reduction of the displacement amount. In addition, since the nonactive parts located so as to interpose the active part in between are provided each with the release portion, the restraint force by the nonactive parts can be released in a well-balanced manner. For this reason, it is feasible to suppress the variation of the displacement amount in the displacement direction of the multilayer piezoelectric element.

The release portion is preferably a groove whose depth direction agrees with the direction intersecting with the displacement direction. This permits the release portion to release the restraint on the displacement of the active part, without decrease in a bond area of the multilayer piezoelectric element when bonded to be fixed to a fixing object. Therefore, it is feasible to improve the displacement amount of the multilayer piezoelectric element and to prevent bonding failure, inclination, etc. in a work of fixing the multilayer piezoelectric element to the fixing object.

The release portion is preferably provided in a piezoelectric layer constituting an outermost layer of the multilayer body. This makes it feasible to more effectively suppress the reduction of displacement of the active part, for example, when the multilayer piezoelectric element is fixed at a desired position through the outermost layer.

The release portion may be provided between the internal electrodes. This makes it feasible to effectively generate distortion by piezoelectric effect between the internal electrodes.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 2 is a schematic diagram illustrating states with application of a voltage to external electrodes of conventional multilayer piezoelectric elements.

FIG. 4 is a diagram illustrating a production method of the multilayer piezoelectric element illustrated in FIG. 1.

FIG. 7 is a diagram illustrating modification examples of the multilayer piezoelectric element according to the embodiment of the present invention.

DESCRIPTION OF THE PREFERRED EMBODIMENTS

The preferred embodiments of the present invention will be described below in detail with reference to the accompanying drawings. The same elements, or elements with the same function will be denoted by the same reference symbols in the description, without redundant description.

Figure 1:
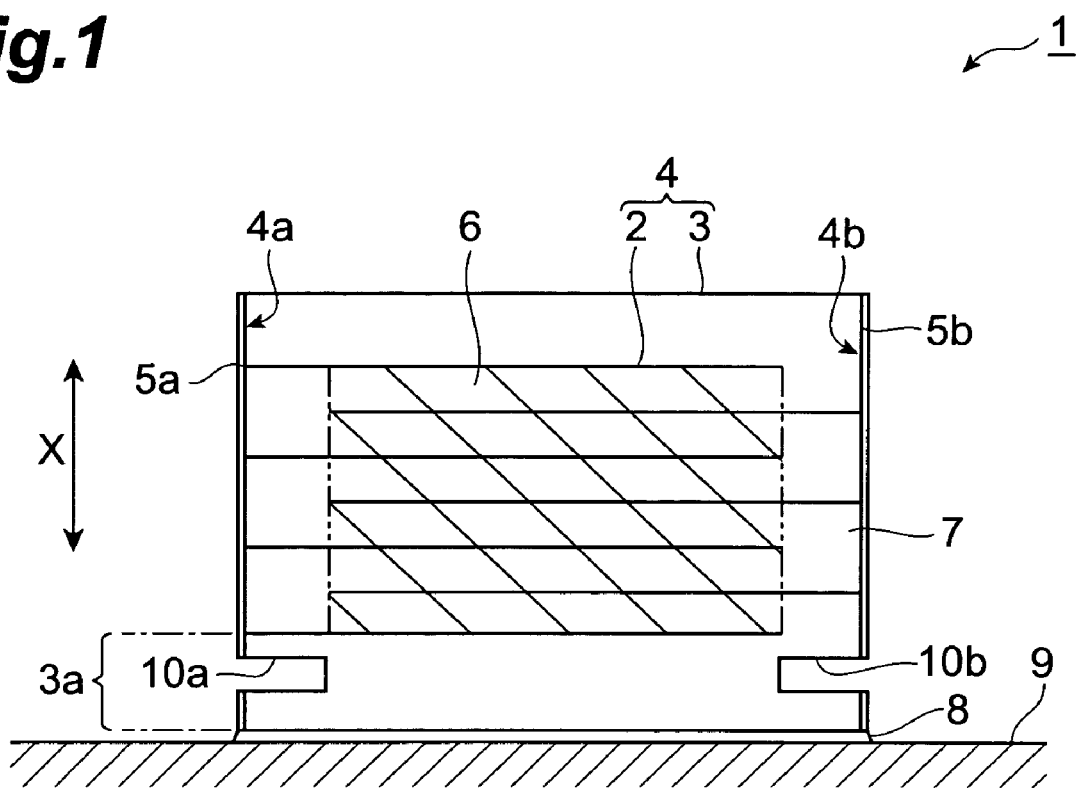
FIG. 1 is a schematic diagram illustrating a cross section of a multilayer piezoelectric element according to an embodiment of the present invention.

FIG. 1 is a schematic diagram illustrating a cross section of a multilayer piezoelectric element according to an embodiment of the present invention. As shown in FIG. 1, the multilayer piezoelectric element 1 is provided with a multilayer body 4, and external electrodes 5a, 5b. The multilayer body 4 is composed of a stack of piezoelectric sheets (piezoelectric layers) 3 with internal electrodes 2 thereon. The external electrodes 5a, 5b are formed on respective end faces 4a, 4b of the multilayer body 4 facing each other in the direction perpendicular to the stack direction of the multilayer body 4. The multilayer piezoelectric element 1 represented in FIG. 1 is a so-called d33 type actuator, in which the stack direction is identical to the displacement direction.

The external electrodes 5a, 5b are formed, for example, by applying a silver paste onto the end faces and baking it. A lead wire is connected to each of the external electrodes 5a, 5b by a solder or the like, for example, by use of a flexible printed circuit board (FPC) or the like electrically connected to an unrepresented external power supply, in order to drive (or displace) the multilayer piezoelectric element 1, and a voltage is applied through the lead wires to the external electrodes.

The piezoelectric sheets 3 contain a ceramic such as lead zirconate titanate (PZT) as a principal component. The piezoelectric sheets 3 are formed in a rectangular thin plate shape. The internal electrodes 2 contain silver and palladium as principal components. The internal electrodes 2 are formed in a pattern by screen printing.

The parallel internal electrodes 2 each are alternately drawn out up to edge parts of the end faces 4a, 4b of the multilayer body 4, and are alternately connected to either of the external electrodes 5a, 5b. Therefore, when the voltage is applied to the external electrodes 5a, 5b, the internal electrodes 2 adjacent to each other come to have mutually different polarities.

The multilayer body 4 has an active part 6 and nonactive parts 7. The active part 6 is a region which is piezoelectrically active and which is constructed in a configuration in which the internal electrodes 2 are arranged at predetermined intervals. The nonactive parts 7 are regions except for the active part 6, and piezoelectrically inactive region. The active part 6 is a hatched region surrounded by internal electrodes 2 and chain double-dashed lines represented in FIG. 1, and region in which adjacent internal electrodes 2 are overlapping in the stack direction X. The nonactive parts 7 located so as to interpose the active part 6 in between in the direction intersecting with the displacement direction of the active part 6 are a region in which adjacent internal electrodes 2 are not overlapping in the stack direction X, and region between each of the end faces 4a, 4b and the active part 6.

In the multilayer piezoelectric element 1, the piezoelectric sheet 3a is provided with a pair of release portions 10a, 10b of groove shape. The depth direction of the groove-shaped release portions 10a, 10b agrees with the direction nearly perpendicular to the stack direction (displacement direction of the active part 6) X. The piezoelectric sheet 3a constitutes an outermost layer of the multilayer body 4, and is a portion located so as to interpose the active part 6 in between in the direction nearly perpendicular to the stack direction X, in the nonactive parts 7.

The outermost layer of the multilayer piezoelectric element 1 is fixed through adhesive 8 to a fixing object 9. When the voltage is applied from the outside to the external electrodes 5a, 5b, the active part 6 becomes distorted, whereupon the multilayer piezoelectric element 1 is displaced in a direction to move away from the fixing object 9 (in the upward direction of the stack direction X represented in the drawing). At this time, the release portions 10a, 10b release the force caused in the stack direction X by the nonactive parts 7 so as to act to restrain the displacement of the active part 6.

Figure 3:
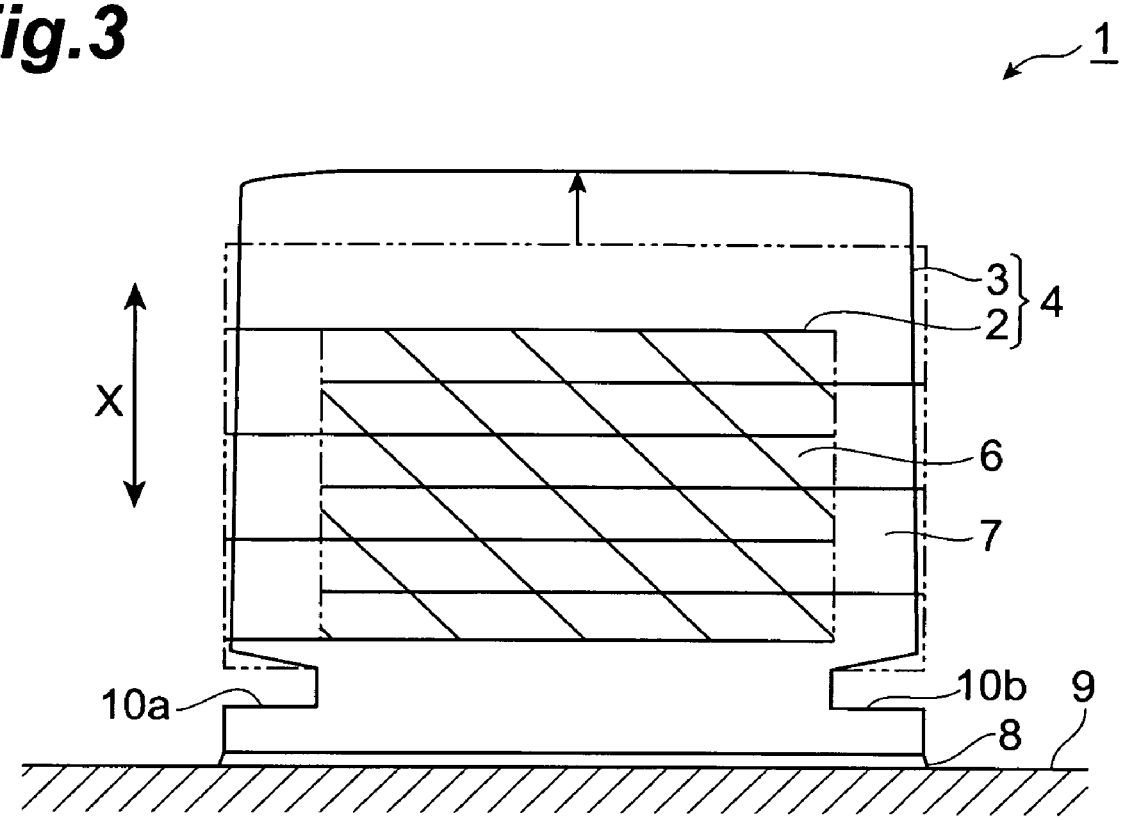
FIG. 3 is a schematic diagram illustrating a state with application of a voltage to external electrodes of the multilayer piezoelectric element illustrated in FIG. 1.

FIG. 2 is a schematic diagram illustrating states with application of the voltage to the external electrodes of conventional multilayer piezoelectric elements. FIG. 3 is a schematic diagram illustrating a state with application of the voltage to the external electrodes 5a, 5b of the multilayer piezoelectric element 1 represented in FIG. 1. FIGS. 2 and 3 are illustrated without the illustration of the external electrodes, the external power supply for applying the voltage to the external electrodes, and so on.

The multilayer piezoelectric element 80 represented in (a) in FIG. 2 is provided with no release portion in the nonactive parts 7. In the multilayer piezoelectric element 80, the force to restrain the displacement of the active part 6 acts because of nonactive regions 7a, 7a (cross-hatching portions in the drawing) located at the corners of the multilayer body 4 on the bond side to the fixing object 9, so as to decrease the distortion amount of the active part 6. This reduces the displacement amount of the multilayer body 4.

On the other hand, the multilayer piezoelectric element 90 represented in (b) in FIG. 2 is provided with a notch part 91 of an L-shaped cross section on the bond side to the fixing object 9 in one end face 4a of the multilayer body 4. The bond side to the fixing object 9 in one end face 4b of the multilayer body 4 is formed as the nonactive region 7a. When the voltage is applied to the external electrodes of the multilayer piezoelectric element 90, the force to restrain the displacement of the active part 6 acts in the nonactive region 7a, while the force to restrain the displacement of the active part 6 is released in the notch part 91. For this reason, the displacement amount becomes larger on the notch part 91 side of the multilayer body 4 than on the nonactive region 7a side. Therefore, the upper end face of the multilayer body 4 becomes inclined relative to the direction perpendicular to the stack direction X.

In contrast to it, the multilayer piezoelectric element 1 of the present embodiment acts as follows: when the voltage is applied to the external electrodes 5a, 5b, as represented in FIG. 3, the groove width of the release portions 10a, 10b is widened with displacement of the active part 6, to release the force caused by the nonactive parts 7 so as to restrain the displacement of the active part 6. This suppresses the decrease of displacement of the multilayer body 4, so that the displacement amount of the multilayer piezoelectric element 1 becomes larger than that of the conventional multilayer piezoelectric element 80 represented in (a) in FIG. 2. Since the release portions 10a, 10b are provided in the nonactive parts 7 located so as to interpose the active part 6 in between in the direction perpendicular to the stack direction X, the force to restrain the displacement of the active part 6 is almost uniformly released in the width direction (direction perpendicular to the stack direction X) of the multilayer body 4. For this reason, with displacement of the multilayer body 4, the upper end face of the multilayer body 4 is kept uninclined and nearly parallel to the direction perpendicular to the stack direction X, and thus the variation is reduced in the displacement amount of the multilayer piezoelectric element 1.

Next, a production method of the multilayer piezoelectric element 1 will be described with reference to FIG. 4.

First, a paste is prepared by mixing an organic binder, an organic solvent, etc. into a piezoelectric material consisting primarily of a ceramic such as lead zirconate titanate (PZT), and a plurality of green sheets of rectangular thin plate shape for piezoelectric sheets 3 are formed using the paste. An electroconductive paste for formation of electrode patterns is prepared by mixing an organic binder, an organic solvent, etc. into a metal material consisting of silver and palladium at a predetermined ratio. Then the conductive paste is screen-printed onto each of the green sheets to form an electrode pattern corresponding to the internal electrode 2. At this time, the electrode pattern corresponding to the internal electrode 2 is formed in a state in which a part thereof is led out up to the edge part of the green sheet.

The plurality of green sheets with the internal electrodes formed as described above are stacked, and pressed in the stack direction to prepare a green laminate. The electrode patterns corresponding to the internal electrodes 2 are stacked in a state in which they are alternately drawn out up to the opposed end faces of the laminate green sheets (end faces 4a, 4b of the multilayer body 4). Then the green laminate is degreased and fired to obtain the multilayer body 4 represented in (a) in FIG. 4.

Subsequently, as shown in (b) in FIG. 4, a silver paste is applied onto the end faces 4a, 4b of the multilayer body 4, and thereafter baked to form the external electrodes 5a, 5b. This results in connecting every other internal electrode 2 juxtaposed in the stack direction, to one of the external electrodes 5a, 5b. Therefore, when the external electrodes 5a, 5b are arranged to have mutually different polarities, adjacent internal electrodes 2 can have mutually different polarities. The external electrodes 5a, 5b may also be formed by sputtering, vacuum evaporation, or the like. Thereafter, a predetermined voltage is applied to the external electrodes 5a, 5b to perform a polarization process.

Next, the piezoelectric sheet 3a forming the outermost layer of the multilayer body 4 is cut including the external electrodes 5a, 5b in the multilayer body 4 with a dicer, a slicer, or the like. This forms the release portions 10a, 10b of groove shape whose depth direction agrees with the direction nearly perpendicular to the stack direction X, as shown in (c) in FIG. 4, to complete the multilayer piezoelectric element 1.

Figure 5:
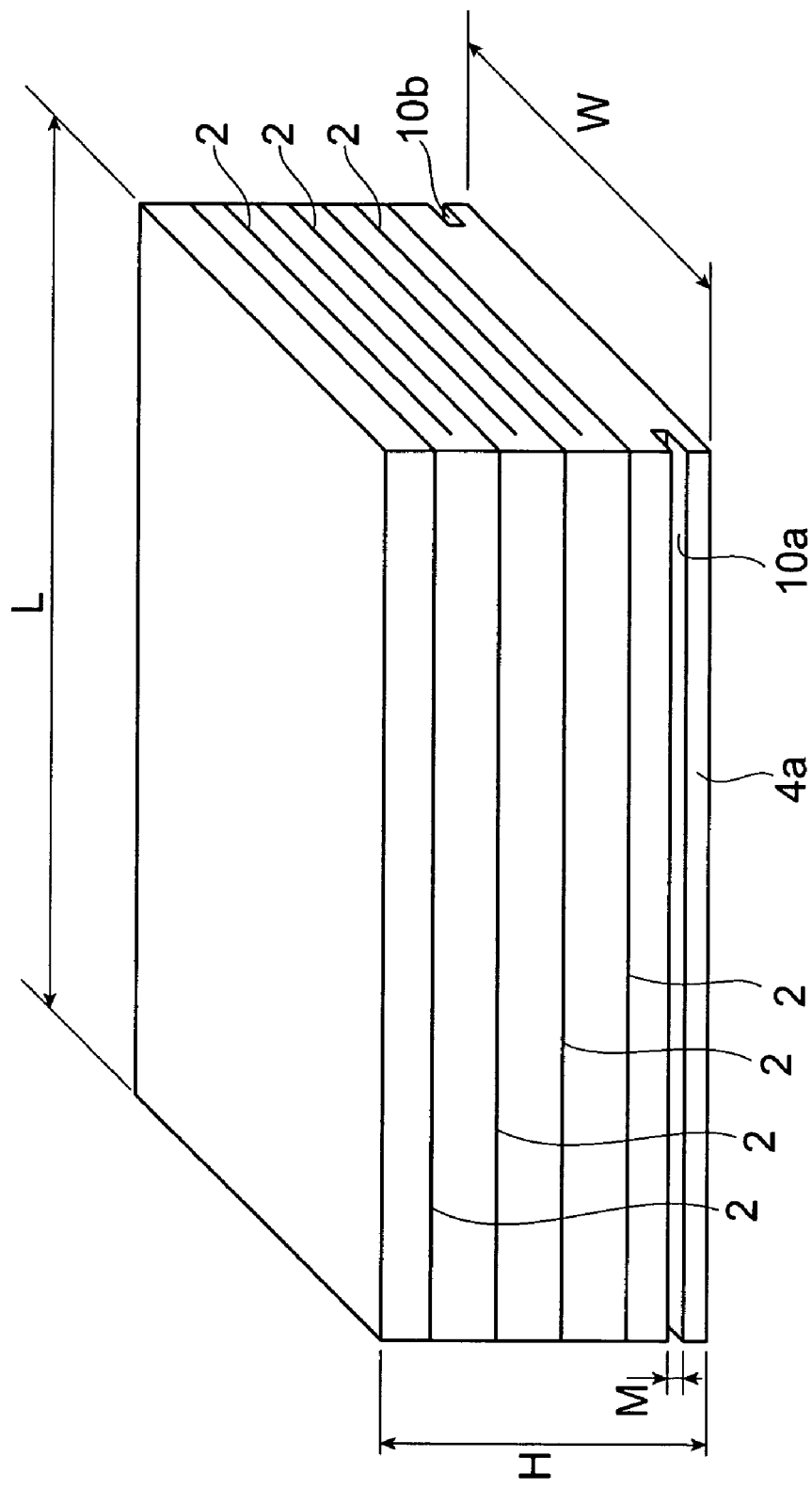
FIG. 5 is a schematic perspective view illustrating a state without external electrodes of the multilayer piezoelectric element illustrated in FIG. 1.

FIG. 5 is a schematic perspective view illustrating a state without the external electrodes 5a, 5b of the multilayer piezoelectric element 1. As shown in the same figure, the groove-shaped release portions 10a, 10b are formed in a continuously cut state from end to end of each surface, in each of the end faces 4a, 4b of the multilayer body 4. The resultant multilayer piezoelectric element 1 has, for example, the width W of about 2.0 mm, the height H of about 2.0 mm, and the length L of about 20 mm. The release portions 10a, 10b have the groove width M of about 10–20 μm. Such multilayer piezoelectric element 1 is optionally subjected to a girdering process according to its use from the state represented in FIG. 5, for example, into a state in which multilayer piezoelectric elements of girder shape 100 μm wide are arrayed in the direction of length L.

Figure 6:
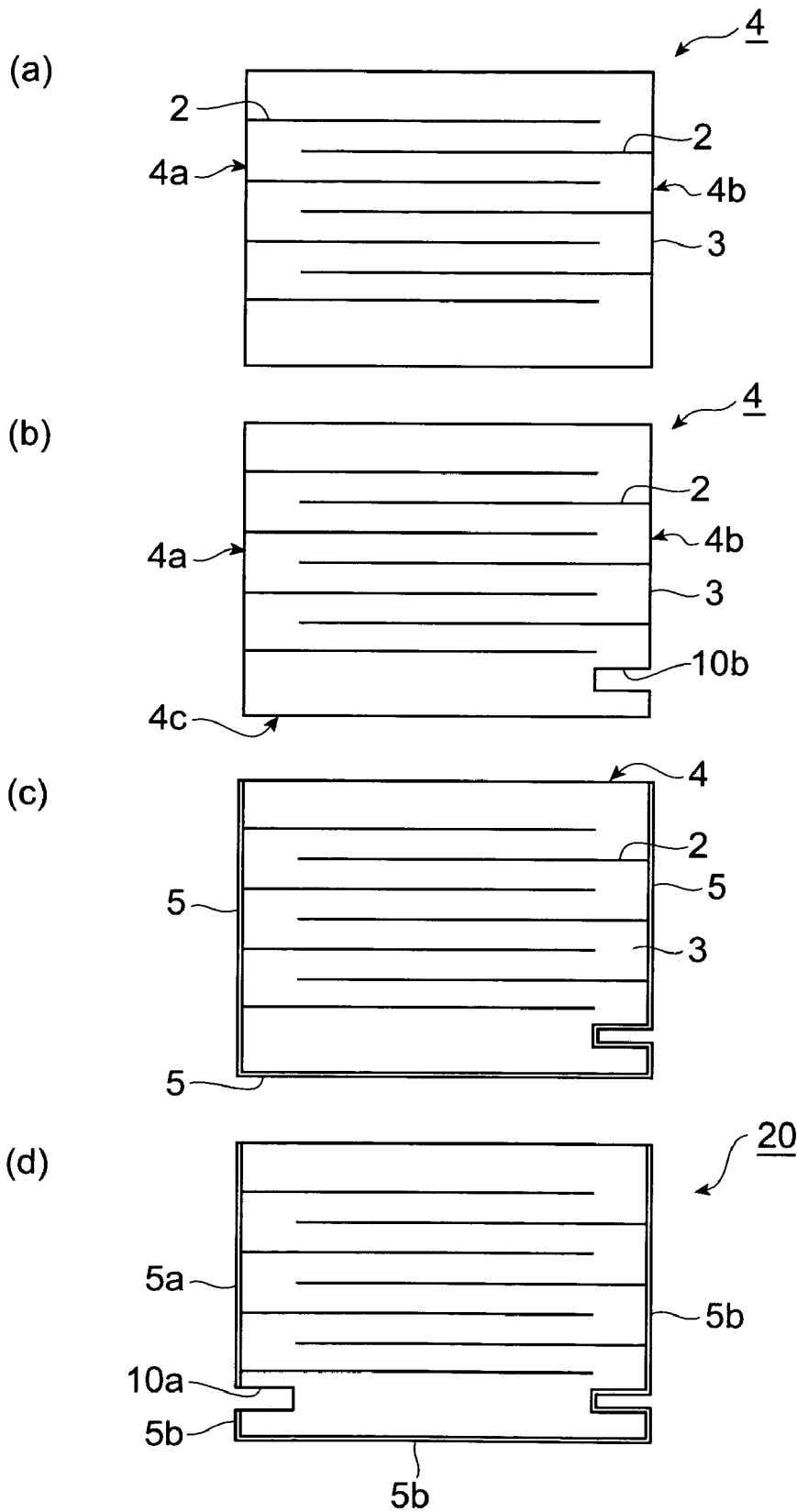
FIG. 6 is a diagram illustrating a production method of a multilayer piezoelectric element of another form.

FIG. 6 is a diagram illustrating a production method of a multilayer piezoelectric element of another form. The multilayer piezoelectric element 20 represented in FIG. 6 is different in the method of forming the external electrodes 5a, 5b, and is of a structure in which the external electrodes 5a, 5b both are placed on one end face of the multilayer body 4.

For forming the multilayer piezoelectric element 20 in this form, the multilayer body 4 represented in (a) in FIG. 4 is first formed according to the procedure described above (cf. (a) in FIG. 6). Then, as shown in (b) in FIG. 6, one end face of the multilayer body 4 (end face 4b in the drawing) is cut with a dicer, a slicer, or the like to form a groove (release portion 10b). Next, as shown in (c) in FIG. 6, a silver paste is applied onto the both end faces 4a, 4b and bottom face 4c of the multilayer body 4, and thereafter baked to form an external electrode film 5. Then the other end face (end face 4a in the drawing) of the multilayer body 4 is cut with a dicer, a slicer, or the like to form a groove (release portion 10a). This separates the external electrode film 5 into two regions, an external electrode 5a formed on the end face 4a of the multilayer body 4 and an external electrode 5b continuously formed on the end face 4b, bottom face 4c, and end face 4a of the multilayer body 4. The above completes the multilayer piezoelectric element 20. The external electrode film 5 may also be formed by sputtering, vacuum evaporation, or the like.

The multilayer piezoelectric element 20 of this form is of a structure in which the two external electrodes 5a, 5b both are placed on one end face. This facilitates a connecting work between the external electrodes 5a, 5b and lead wires or the like, and thus enables space saving of a product equipped with the multilayer piezoelectric element 20, simplification of structure, and so on.

FIG. 7 is a diagram illustrating modification examples of the multilayer piezoelectric element of the present embodiment. The multilayer piezoelectric element 30 represented in (a) in FIG. 7 is provided with release portions 31a, 31b, which are made by chamfering or cutting the corners on the bond side to the fixing object 9. In this structure, when the voltage is applied to the external electrodes 5a, 5b, the release portions 31a, 31b function in the same manner as the release portions 10a, 10b of the multilayer piezoelectric element 1. For this reason, the variation is reduced in the displacement amount of the multilayer body 4, and the decrease of displacement of the multilayer body 4 is further suppressed.

In the multilayer piezoelectric element 40 represented in (b) in FIG. 7, the piezoelectric sheet 3a forming the outermost layer of the multilayer body 4 is provided with a pair of release portions 44a, 44b. In the multilayer piezoelectric element 40, release portions 41a–44a, 41b–44b are provided between each pair of internal electrodes 2 so as to interpose the active part in between. The multilayer piezoelectric element 40 is produced by the production method represented in FIG. 4, and the plurality of release portions 41a–44a, 41b–44b are formed by also cutting the multilayer body between the internal electrodes 2 in the operation of cutting the multilayer body 4 with a dicer, a slicer, or the like. This permits the distortion to be effectively generated between internal electrodes 2 by piezoelectric effect. Since the plurality of release portions are formed, the decrease of displacement of the multilayer body 4 is more effectively suppressed.

The multilayer piezoelectric element 60 represented in (c) in FIG. 7 has the same multilayer body 4 as the multilayer piezoelectric element 40 described above (i.e., they are identical in the number of release portions, the positions thereof, and so on). A plurality of release portions 61a–64a, 61b–64b are formed in the multilayer piezoelectric element 60. The multilayer piezoelectric element 60 is produced by the production method represented in FIG. 6, whereby it is different from the multilayer piezoelectric element 40 in that the external electrode 51b is continuously formed on the end face 4b, bottom face 4c, and end face 4a of the multilayer body 4. This permits the multilayer piezoelectric element 40 represented in (b) in FIG. 7 to be modified into the structure in which two external electrodes 51a, 51b are placed on one end face of the multilayer body 4.

In the above-described multilayer piezoelectric elements 1, 20, 40, 60, the release portions 10a, 10b, 41a–44a, 41b–44b, 61a–64a, 61b–64b are of the groove shape whose depth direction agrees with the direction intersecting with the stack direction. Therefore, the bond area in bonding fixation to the fixing object 9 is larger than that in the multilayer piezoelectric element 30, and it thus prevents bonding failure, inclination, etc. in the work of fixing the element to the fixing object 9.

In the multilayer piezoelectric elements 1, 20, 40, 60, the release portions 10a, 10b, 44a, 44b, 64a, 64b are provided in the piezoelectric sheet 3a forming the outermost layer of the multilayer body 4, and are located between the fixing object 9 and the active part 6. Therefore, the restraint on the displacement of the active part 6 can be more effectively released.

Figure 8:
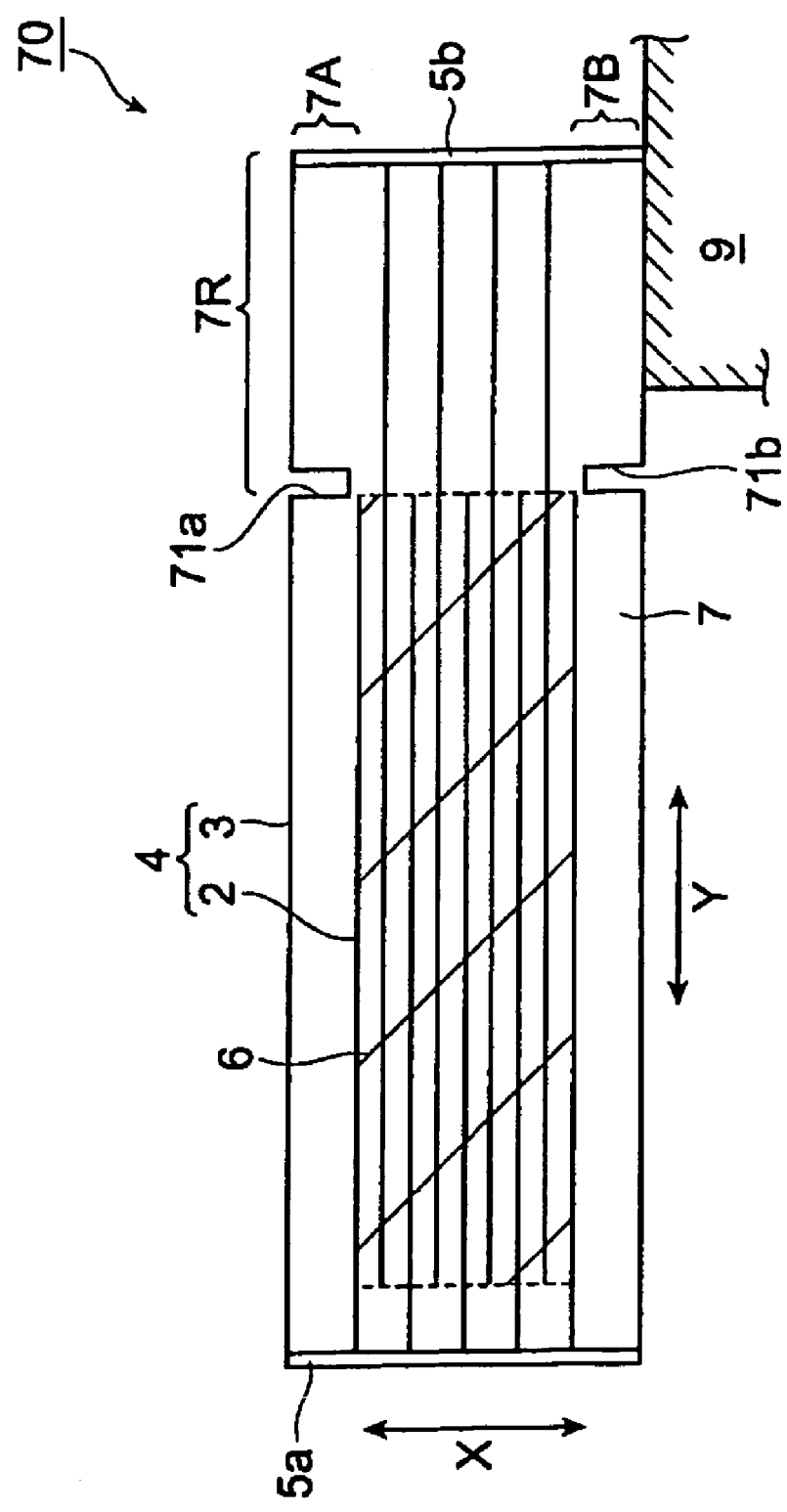
FIG. 8 is a diagram illustrating another modification example of the multilayer piezoelectric element according to the embodiment of the present invention.

FIG. 8 is a diagram illustrating another modification example of the multilayer piezoelectric element of the present embodiment. The multilayer piezoelectric element 70 represented in the same figure is a d31 type actuator. Namely, the stack direction X and the displacement direction are coincident in the aforementioned multilayer piezoelectric elements 1, 20, 30, 40, 60, whereas the stack direction X and the displacement direction Y are approximately perpendicular to each other in the multilayer piezoelectric element 70.

The multilayer piezoelectric element 70, similar to the aforementioned multilayer piezoelectric element 1, has a multilayer body 4, and external electrodes 5a, 5b formed on end faces 4a, 4b of the multilayer body 4. The multilayer body 4 is made by stacking a plurality of piezoelectric sheets 3 with internal electrodes 2 formed thereon.

The multilayer body 4 has an active part 6 and nonactive parts 7. The active part 6 is a region which is constructed as interposed between parallel internal electrodes 2. The nonactive parts 7 are regions except for the active part 6. In the nonactive parts 7, one (nonactive region 7R represented in FIG. 8) of regions located so as to interpose the active part 6 in between in the displacement direction Y is fixed to a fixing object 9. Nonactive regions 7A, 7B located so as to interpose the active part 6 in between in the stack direction X of the active part 6 are provided with their respective release portions 71a, 71b of groove shape cut in the stack direction X.

In the multilayer piezoelectric element 70 of this form, when the voltage is applied from the outside to the external electrodes 5a, 5b, the active part 6 becomes distorted, whereupon the multilayer piezoelectric element 1 is displaced in the direction (displacement direction Y) perpendicular to the stack direction X. At this time, the groove width of the release portions 71a, 71b is widened with displacement of the active part 6, to release the force caused by the nonactive parts 7 so as to restrain the displacement of the active part 6 (the force acting in the displacement direction Y). Therefore, the decrease of displacement of the multilayer piezoelectric element 70 is suppressed.

The above described the preferred embodiments of the present invention in detail, but it is noted that the present invention is by no means intended to be limited to the above embodiments. For example, the release portions may be arranged so that at least one release portion is provided in each of the nonactive regions located so as to interpose the active part in between in the direction intersecting with the displacement direction of the active part, or the numbers of release portions may be different between the nonactive regions, e.g., one release portion for one nonactive region and two for the other.

The present invention will be more concretely described below on the basis of Example and Comparative Examples, but the present invention is by no means limited to the examples below.

COMPARATIVE EXAMPLE 1

Figure 9:
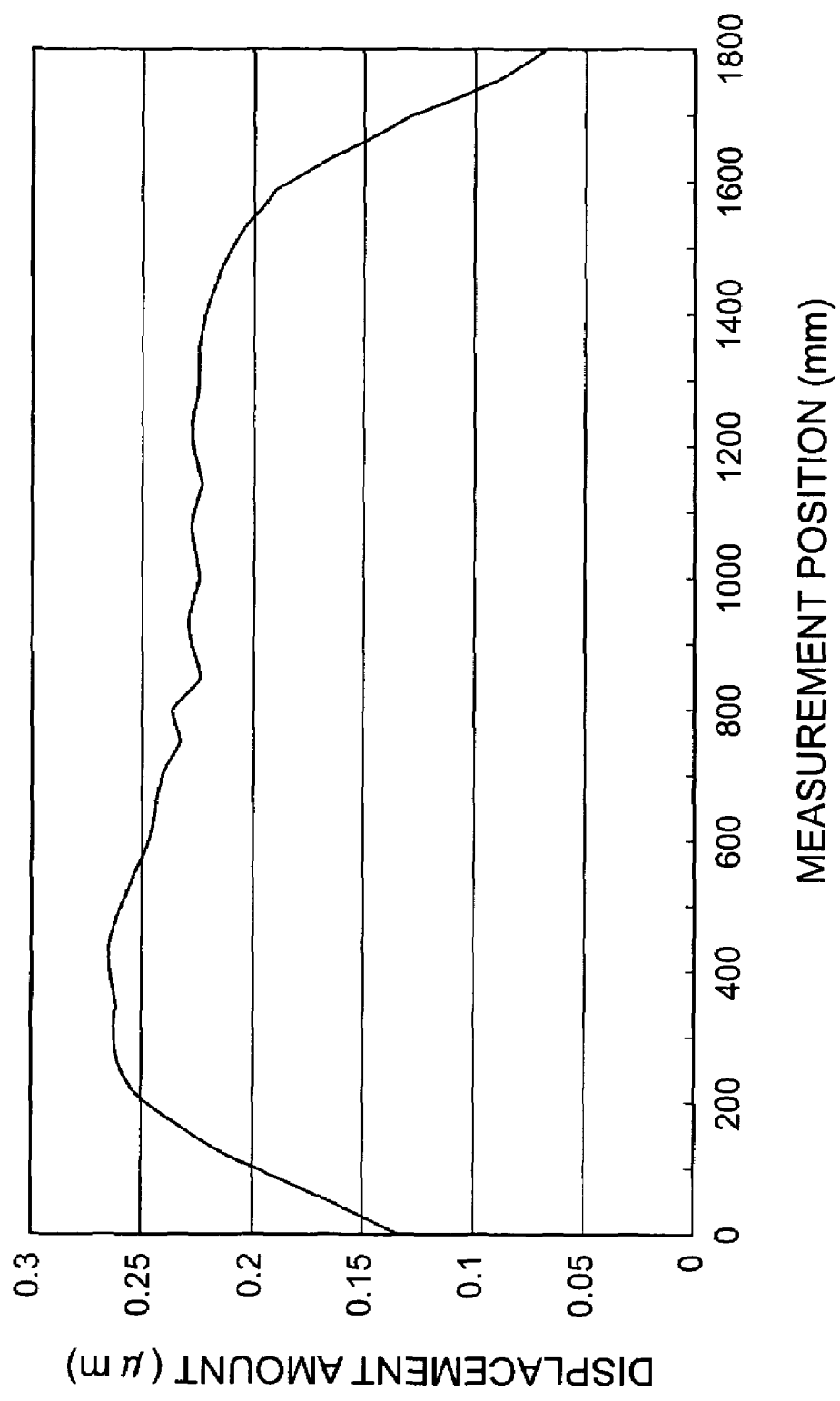
FIG. 9 is a diagram illustrating a displacement distribution in the width direction of an upper end face in a multilayer piezoelectric element illustrated in FIG. 10.
Figure 10:
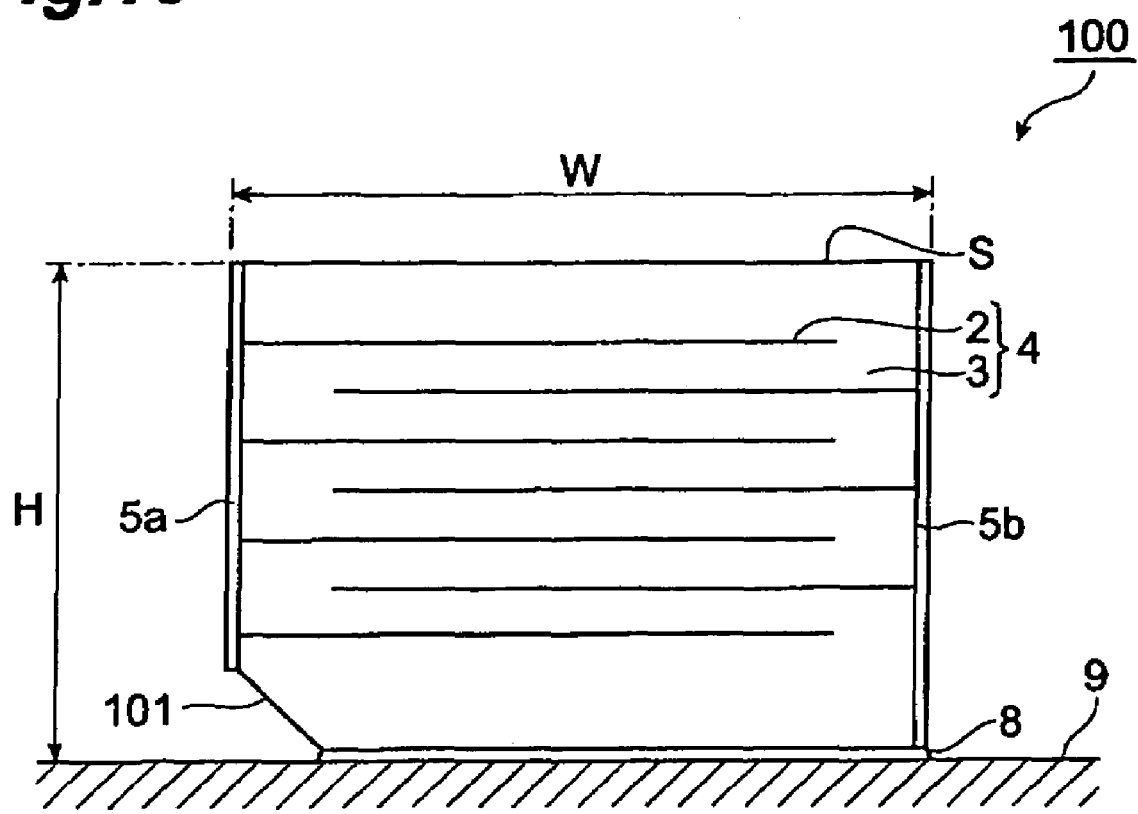
FIG. 10 is a schematic diagram illustrating a multilayer piezoelectric element according to Comparative Example 1.

FIG. 9 is a diagram illustrating a displacement distribution in the direction of the width W of the upper end face S in a multilayer piezoelectric element 100 represented in FIG. 10. The multilayer piezoelectric element 100 represented in FIG. 10 has a structure in which one corner of the multilayer body 4 is chamfered on the bond side to the fixing object 9. Namely, a notch part 101 is formed on the external electrode 5a side in the multilayer body 4.

The dimensions of the multilayer piezoelectric element 100 are as follows: the width W 2.0 mm and the height H 2.0 mm. In Comparative Example 1, the voltage equivalent to 1.5 (kV/mm) was applied to the external electrodes 5a, 5b to displace the multilayer piezoelectric element 100, and displacement amounts (μm) in the width direction of the upper end face S were measured.

In FIG. 9, the measurement position 0 (mm) is defined at an end on the external electrode 5a side (notch 101 side) of the upper end face S, and a distribution of displacement amounts is presented from the measurement position 0 to the external electrode 5b. As shown in FIG. 9, it was confirmed that the upper end face S was inclined while the displacement amounts were large on the side where the notch part 101 was formed.

COMPARATIVE EXAMPLE 2

In Comparative Example 2, the displacement distribution in the width direction of the upper end face was measured in the multilayer piezoelectric element 80 represented in (a) in FIG. 2. In Comparative Example 2, as in Comparative Example 1, the dimensions of the multilayer piezoelectric element 80 were the width W of 2.0 mm and the height H of 2.0 mm. In Comparative Example 2, the voltage equivalent to 1.5 (kV/mm) was applied to the external electrodes 5a, 5b to displace the multilayer piezoelectric element 80, and displacement amounts (μm) in the width direction of the upper end face were measured. The result of the measurement is indicated by a broken line $L_{80}$ in FIG. 11.

EXAMPLE 1

In Example 1, the displacement distribution in the width direction of the upper end face was measured in the multilayer piezoelectric element 30 represented in (a) in FIG. 7. In this Example 1, as in Comparative Examples 1 and 2, the dimensions of the multilayer piezoelectric element 30 were the width W of 2.0 mm and the height H of 2.0 mm. In Example 1, the voltage equivalent to 1.5 (kV/mm) was applied to the external electrodes 5a, 5b to displace the multilayer piezoelectric element 30, and displacement amounts (μm) in the width direction of the upper end face were measured. The result of the measurement is indicated by a broken line $L_{30}$ in FIG. 11.

Figure 11:
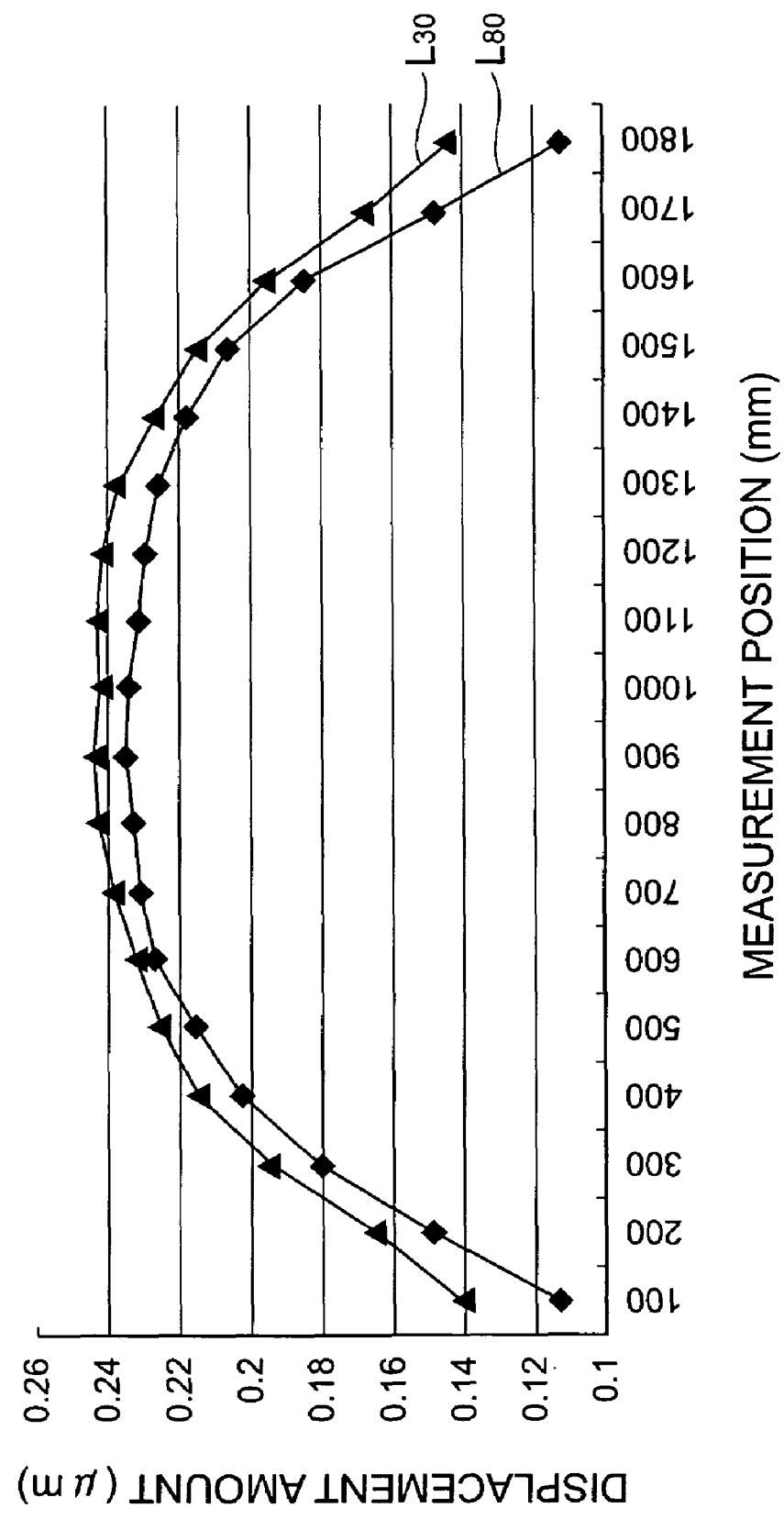
FIG. 11 is a diagram illustrating results of measurement of displacement amounts in the width direction of the upper end face of multilayer piezoelectric elements in Comparative Example 2 and Example 1.

As shown in FIG. 11, it was confirmed that in the multilayer piezoelectric element 30 of Example 1, the upper end face after displaced drew a smooth curve without inclination and the displacement amounts varied around close values without variation near the center (near the measurement positions 800 mm to 1200 mm). It was also confirmed that the multilayer piezoelectric element 30 of Example 1 demonstrated larger displacement amounts across the entire upper end face than the multilayer piezoelectric element 80 of Comparative Example 2.

Figure 12:
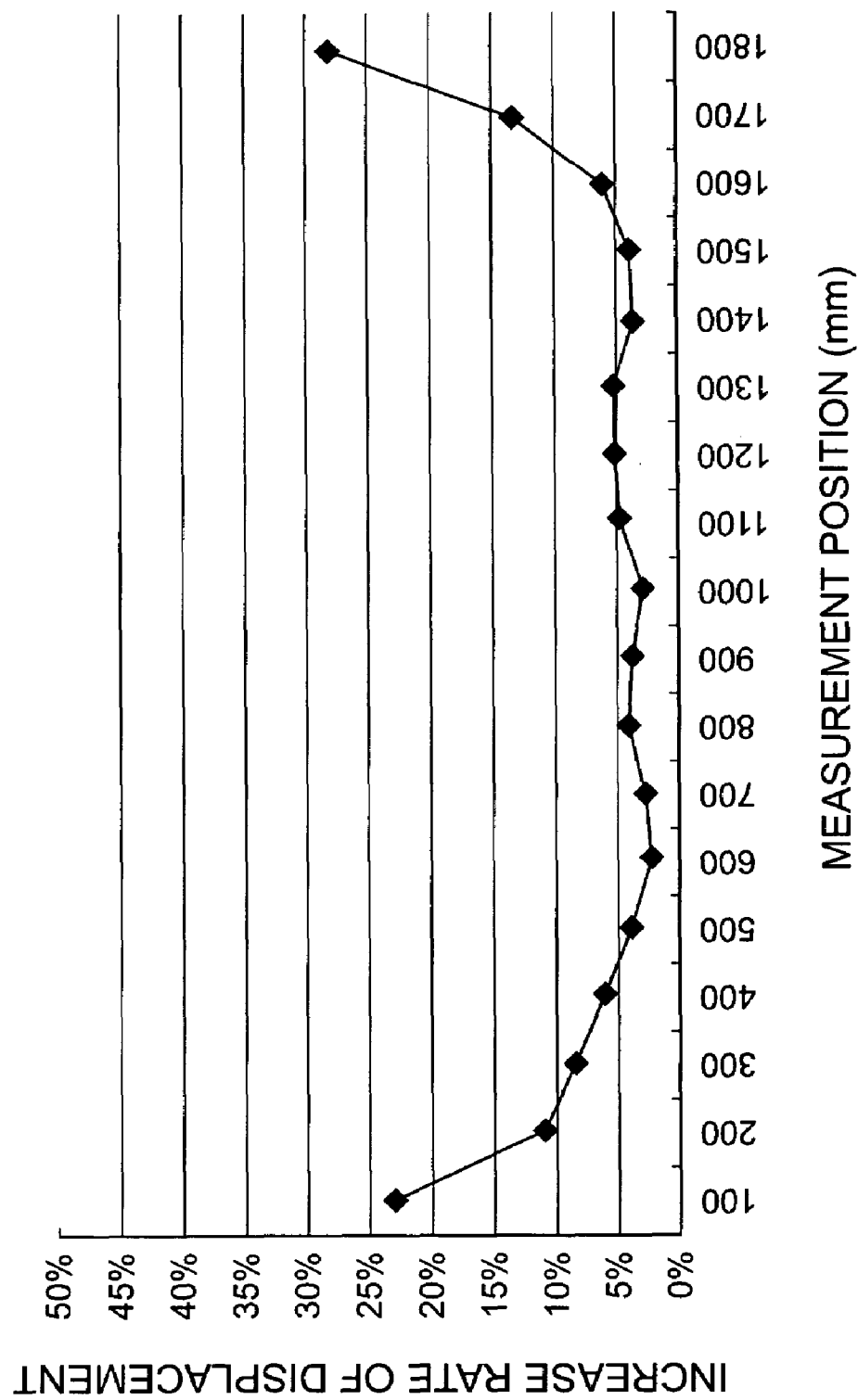
FIG. 12 is a diagram illustrating increase rates of displacement of the multilayer piezoelectric element of Example 1 to the multilayer piezoelectric element of Comparative Example 2.

FIG. 12 is a diagram illustrating increase rates (%) of displacement of the multilayer piezoelectric element 30 of Example 1 to the multilayer piezoelectric element 80 of Comparative Example 2. As shown in FIG. 12, the multilayer piezoelectric element 30 of Example 1 demonstrates the total increase of displacement amounts when compared with the multilayer piezoelectric element 80 of Comparative Example. It was confirmed from this fact that the multilayer piezoelectric element 30 of Example 1 successfully achieved the release of the restraint on the displacement and the suppression of the decrease of displacement amount by virtue of provision of the release portions.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A multilayer piezoelectric element, comprising:
    a multilayer body in which a plurality internal electrodes are arranged between stacked piezoelectric layers, and a plurality of external electrodes are disposed on the multilayer body, wherein:
        the multilayer body has an active part piezoelectrically active, and nonactive parts piezoelectrically nonactive, the nonactive parts being located so as to interpose the active part in between in a direction intersecting with a displacement direction of the active part,
    the multilayer body includes at least a first end face, a second end face and a bottom face, the first end face and the second end face opposing each other,
    each of the nonactive parts includes at least one of the first end face and the second end face of the multilayer body, the nonactive parts including at least one release portion for releasing restraint on displacement of the active part,
    the release portion is provided in the piezoelectric layer forming an outermost layer of the multilayer body,
    the release portion is a groove whose depth direction agrees with the direction intersecting with the displacement direction,
    one of the plurality of external electrodes is formed on the first end face, and another of the plurality of external electrodes is continuously formed on the first end face, the second end face and the bottom face of the multilayer body,
    the one of the plurality of external electrodes and the another of the plurality of external electrodes face across the groove, and
    each of the plurality of internal electrodes includes a first internal electrode connected to the one of the plurality of external electrodes at the first end face and a second internal electrode connected to the another of the plurality of external electrodes at the second end face.

2. The multilayer piezoelectric element according to claim 1, wherein the release portion is providedhetween the internal electrodes.

3. The multilayer piezoelectric element according to claim 1, wherein the outermost layer of the multilayer body is fixed to an object.

* * * * *